United States Patent
Ayers et al.

(10) Patent No.: US 10,659,714 B2
(45) Date of Patent: *May 19, 2020

(54) IMAGE SENSOR AND ELECTRONIC DEVICE WITH ACTIVE RESET CIRCUIT, AND METHOD OF OPERATING THE SAME

(71) Applicant: Sony Corporation, Tokyo (JP)

(72) Inventors: Thomas Ayers, Morgan Hill, CA (US); Jinsuk Kang, Palo Alto, CA (US); Brian Carey, Sunnyvale, CA (US); Noam Eshel, Pardesia (IL); Frederick Brady, Webster, NY (US)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/148,137

(22) Filed: Oct. 1, 2018

(65) Prior Publication Data

US 2019/0089918 A1   Mar. 21, 2019

Related U.S. Application Data (63) Continuation of application No. 15/617,394, filed on Jun. 8, 2017, now Pat. No. 10,110,841, which is a
(Continued)

(51) Int. Cl.
*H04N 5/378* (2011.01)
*H04N 5/225* (2006.01)
(Continued)

(52) U.S. Cl.
CPC ....... *H04N 5/378* (2013.01); *H01L 27/14612* (2013.01); *H04N 5/2251* (2013.01);
(Continued)

(58) Field of Classification Search
CPC ...... H04N 5/378; H04N 5/3742; H04N 5/369; H04N 5/363; H04N 5/3575;
(Continued)

(56) References Cited

U.S. PATENT DOCUMENTS

2004/0201761 A1   10/2004   Mentzer
2005/0092895 A1   5/2005   Fossum
(Continued)

FOREIGN PATENT DOCUMENTS

| EP | 1 301 028 A1 | 4/2003 |
|---|---|---|
| EP | 1 635 470 A1 | 3/2006 |
| JP | 2001-223566 A | 8/2001 |

OTHER PUBLICATIONS

International Search Report dated Mar. 30, 2017 for corresponding application PCT/2016/089047.

*Primary Examiner* — Shahbaz Nazrul
(74) *Attorney, Agent, or Firm* — Michael Best & Friedrich LLP (57) ABSTRACT

An image sensor including a pixel circuit and an active reset circuit. The pixel circuit includes a light sensing element, a storage node selectively connected to the light sensing element, an output transistor configured to, during a readout operation, output a signal that is based on a potential of the charge storage node to an output line, and a selection transistor that controls the readout operation. The active reset circuit includes a first current path and a second current path, the first current path extending from a power supply node to the output line via the selection transistor and the output transistor, and the second current path extending from the power supply node to the output line via a first transistor and a second transistor. The active reset circuit is configured to, when the selection transistor and the first transistor are both ON, set a potential of the charge storage node based on a potential of a gate of the second transistor.

10 Claims, 6 Drawing Sheets

Related U.S. Application Data continuation of application No. 15/014,368, filed on Feb. 3, 2016, now Pat. No. 9,736,413.

(51) Int. Cl.
*H04N 5/232* (2006.01)
*H04N 5/357* (2011.01)
*H04N 5/363* (2011.01)
*H04N 5/369* (2011.01)
*H04N 5/374* (2011.01)
*H01L 27/146* (2006.01)
*H04N 5/3745* (2011.01)

(52) U.S. Cl.
CPC ....... *H04N 5/23245* (2013.01); *H04N 5/3575* (2013.01); *H04N 5/363* (2013.01); *H04N 5/369* (2013.01); *H04N 5/3742* (2013.01); *H04N 5/37455* (2013.01)

(58) Field of Classification Search
CPC ............. H04N 5/23245; H04N 5/2251; H04N 5/37455; H01L 27/14612
See application file for complete search history.

(56) References Cited

U.S. PATENT DOCUMENTS

| | | |
|---|---|---|
| 2009/0167914 A1 | 7/2009 | Itano et al. |
| 2009/0256060 A1 | 10/2009 | Meynants et al. |
| 2010/0002120 A1* | 1/2010 | Yoshikawa .......... H03K 5/2481 |
| | | 348/312 |
| 2010/0253560 A1 | 10/2010 | Kodo |
| 2010/0302407 A1 | 12/2010 | Ayers et al. |
| 2012/0019697 A1* | 1/2012 | Suzuki ................. H04N 5/3575 |
| | | 348/308 |
| 2012/0154656 A1 | 6/2012 | Oike et al. |
| 2015/0229859 A1 | 8/2015 | Guidash et al. |
| 2015/0360131 A1 | 12/2015 | Tsuchida |

* cited by examiner

IMAGE SENSOR AND ELECTRONIC DEVICE WITH ACTIVE RESET CIRCUIT, AND METHOD OF OPERATING THE SAME

CROSS REFERENCE TO RELATED APPLICATIONS

This is a Continuation Application of U.S. application Ser. No. 15/617,394, filed Jun. 8, 2017, which is a Continuation Application of U.S. application Ser. No. 15/014,368, filed Feb. 3, 2016, now U.S. Pat. No. 9,736,413, issued on Aug. 15, 2017, the entire contents of which are incorporated herein by reference.

BACKGROUND

1. Field of the Invention

The present invention relates generally to image sensors and more particularly to reduction of reset spread in image sensors.

2. Description of the Related Art

Digital image capturing devices use image sensors to convert incident light energy into electrical signals. Image sensor designs include Charged Coupled Devices (CCD), Complementary Metal Oxide Silicon (CMOS) image sensors, and Digital Pixel System (DPS) sensors. An image sensor includes a two-dimensional array of light sensing elements called pixels. Each pixel in the array works with the lens system to respond to incident light within a local area of the scene, and produces an electrical signal describing the characteristics of the scene. The electrical signals that are output from the light sensing elements are converted to digital form, and the resulting digital pixel values form the raw data representing the scene. The raw data can be processed by an image processor to produce rendered digital images.

In CMOS image sensors, various problems arise as a result of reset noise in pixels. Reset noise relates to a variation in the reset level among pixels, and can cause two pixels that received identical light to nonetheless output different pixel values. In particular, the variation in reset level among pixels may make it difficult to know which portion of any given pixel signal is attributable to the reset level of the pixel. This variation of reset level occurs in all pixel designs such as 3T, 4T, and 5T pixels and results from several sources. Major sources of reset voltage level variations include: 1) KTC noise (AKA KT/C noise) which is caused by the random variations in the channel resistance of a reset transistor combined with the total capacitance at the source node of a reset transistor; 2) Reset charge injection which is caused by the high to low transition of a reset signal coupling through a parasitic capacitor between the gate and source of the reset transistor; 3) Process variation of transistors in the circuit, notably the turn on voltage of the reset transistor and drain to source voltage drop Vds of the source follower transistor and the reset transistor; 4) Additional parasitic capacitive coupling effects such as between the reset signal line and photodiode or metal wiring associated with the sense node which is the node connected to the reset transistor; 5) Power and signal distribution effects such as IR drop associated with the pixel voltage and control signals across large arrays; and 6) Offsets and random noise occurring in the readout circuit which processes the column signal line.

Several methods have been developed to minimize reset noise/reset spread in CMOS image sensor pixels, including changing the reset voltage dynamically, controlling the reset gate voltage in order to minimize total reset spread and/or control the reset voltage mean value, and in a 3T pixel separating the source-follower transistor's power-supply node from the reset transistor's drain and connecting the drain to the output of an amplifier and operating the reset transistor in sub-threshold region.

In addition, in 4T and 5T pixels reset noise/reset spread is often addressed by using correlated double sampling (CDS), which removes the reset level from the output pixel signals thus allowing the light-dependent portion of the signal to be obtained independent of the reset level variation. CDS techniques generally involve reading out two signals from the pixel: one signal that is read out while the pixel is being (or immediately after the pixel has been) reset (the reset signal), which indicates the reset level of the pixel, and one signal that is read out when the photodiode generated charge is being held in the floating diffusion (the light-dependent signal, pixel signal or data signal). The reset signal is then subtracted from the light dependent signal, resulting in an output signal from which the reset level is removed. The CDS operation may be performed in the analog or digital domain, or even may be accomplished concurrently with analog-to-digital conversion (such as in a single-slope ADC).

SUMMARY

The CDS operation is generally able to obtain a pixel signal from which the reset level has been removed, and thus the light dependent signal can be obtained regardless of the reset level variation. Thus, the CDS operation is generally able to solve one problem associated with reset noise. However, the reset level variation can still be problematic in image sensors for other reasons. For example, when using digital CDS cancellation techniques, the variation of the reset signal can result in decreased dynamic range for the image sensor, especially under the conditions of high analog gain. The dynamic range of the image sensor is the variation range allowed for the light-dependent portion of the pixel signal, and is an important parameter for image sensor design (generally, lower dynamic range results in lower image quality).

In particular, an ADC has a finite range of input voltages that it can accept, and thus the pixel signals must stay within this range in order for normal ADC operation to be ensured. Since the CDS operation is performed at or after the ADC when digital CDS techniques are used, the pixel signal at the input stage of the ADC still includes the reset level as a part of the signal. Thus, the input voltage range of the ADC must be able to accommodate both the reset level portion and the light dependent portion of the pixel signal. Accordingly, if a particular range of variation in reset levels in an image sensor is assumed, then the designer of the image sensor must set the permissible variation range for the light dependent portion of the image signal (the dynamic range) small enough that the reset level variation range plus the light dependent variation range does not exceed the input voltage range of the ADC. Thus, when the variation of the reset signal among pixels is high, the portion of the input voltage range that can be allocated to the light dependent portion of the signal becomes comparatively low. This is exacerbated under conditions of high analog gain, since the reset variation is magnified when the analog signal is amplified.

For example, suppose the ADC has an input voltage range of 1 V and the variation of the reset voltage signal is 100 mV. In this case the voltage range allocated for the light-dependent portion of the pixel signal is at most 900 mV, since 100 mV of the available 1 V range must be allocated to the reset portion of the pixel signal. Moreover, as the gain of a column-line amplifier situated upstream of the ADC is increased, the reset portion of the signal is amplified such that at a gain of 8× or 18 dB the voltage variation of the reset signal at the input to the ADC is now 800 mV. This leaves only 200 mV for the light dependent portion of the pixel signal. Thus, although the reset level is ultimately removed from the signal by the CDS technique, the reset variation still can degrade image quality by decreasing the dynamic range of the image sensor, and this effect is magnified under conditions of high analog gain. High levels of gain are typically used to amplify the photodiode signal over the circuit noise level of the amplifier and ADC functions and thereby allow the image sensor to generate a useful image at lower light levels and at lower readout noise.

Thus, among other things, the present disclosure achieves higher dynamic range at any gain level and increases the maximum useable dynamic range for the image sensor at least in part by reducing the reset signal variation. For example, according to an exemplary illustration of the present disclosure an image sensor may include a pixel circuit and an active reset circuit. The pixel circuit may include a light sensing element, a storage node selectively connected to the light sensing element, an output transistor configured to, during a readout operation, output a signal that is based on a potential of the charge storage node to an output line, and a selection transistor that controls the readout operation. The active reset circuit may include a first current path and a second current path, the first current path extending from a power supply node to the output line via the selection transistor and the output transistor, and the second current path extending from the power supply node to the output line via a first transistor and a second transistor. The active reset circuit may be configured to, when the selection transistor and the first transistor are both ON, set a potential of the charge storage node based on a potential of a gate of the second transistor. Thus, the image sensor of the exemplary illustration reduces reset level variation in the image sensor.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

In the following description, for purposes of explanation, numerous details are set forth, such as flowcharts and system configurations, in order to provide an understanding of one or more embodiments of the present invention. However, it is and will be apparent to one skilled in the art that these specific details are not required in order to practice the present invention.

[Configuration of Image Sensor]

Figure 1:
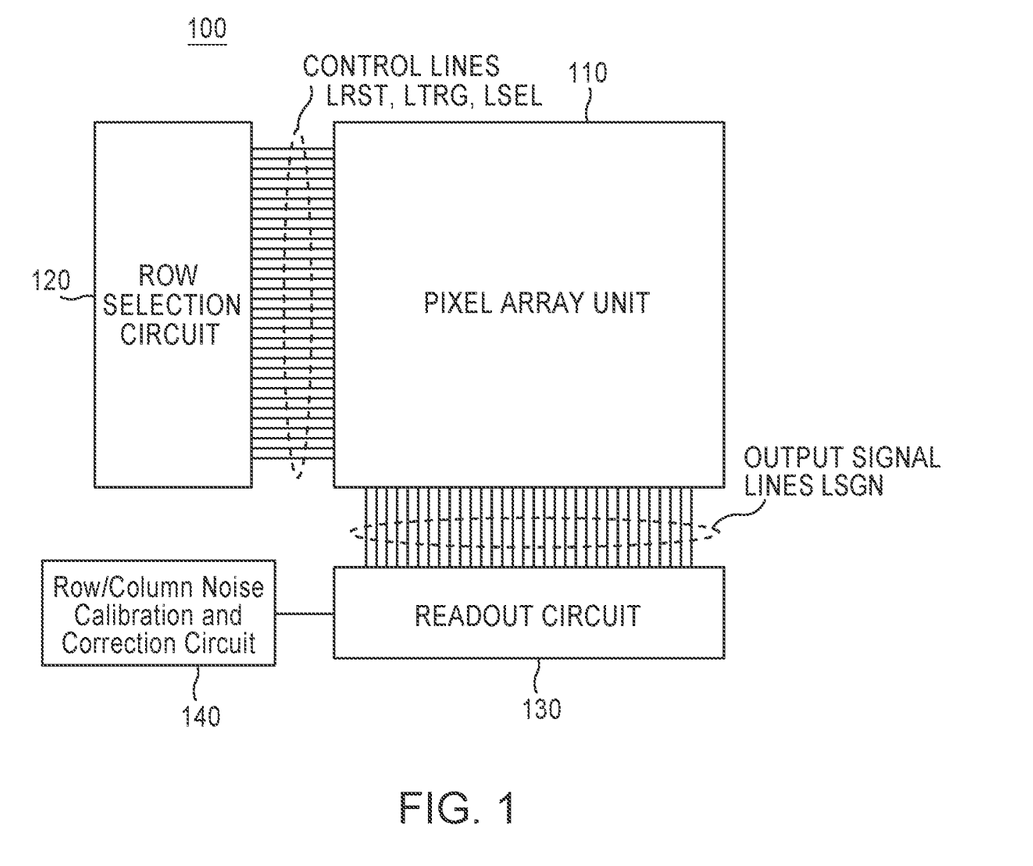
FIG. 1 is a conceptual diagram illustrating an image sensor 100.

FIG. 1 illustrates an exemplary image sensor 100, which includes a pixel array unit 110, a row selection circuit 120, and a readout circuit 130. The pixel array 110 includes multiple pixels 101 arrayed in a pattern such as a matrix of rows and columns. The pixels 101 are controlled by various signals (e.g., TG, SELG, RG, and PRG), which are generated by the row selection circuit 120 and supplied to the pixels 101 via various control lines. Under control of the row selection circuit, the pixels 101 are exposed to light and then signals are read out from the pixel array unit 110 through the readout circuit 130. The readout circuit 130 may read out a group of the signals in parallel (for example, one row at a time), perform various types of processing on the signals (such as analog-to-digital conversion and correlated double sampling), and then output the processed signals in serial (for example, to a storage device or digital signal processor). FIG. 1 merely illustrates one example of an image sensor. Various CMOS image sensor architectures are known, and thus need not be described herein in any greater detail.

[Configuration of Pixel Circuit]

Figure 2:
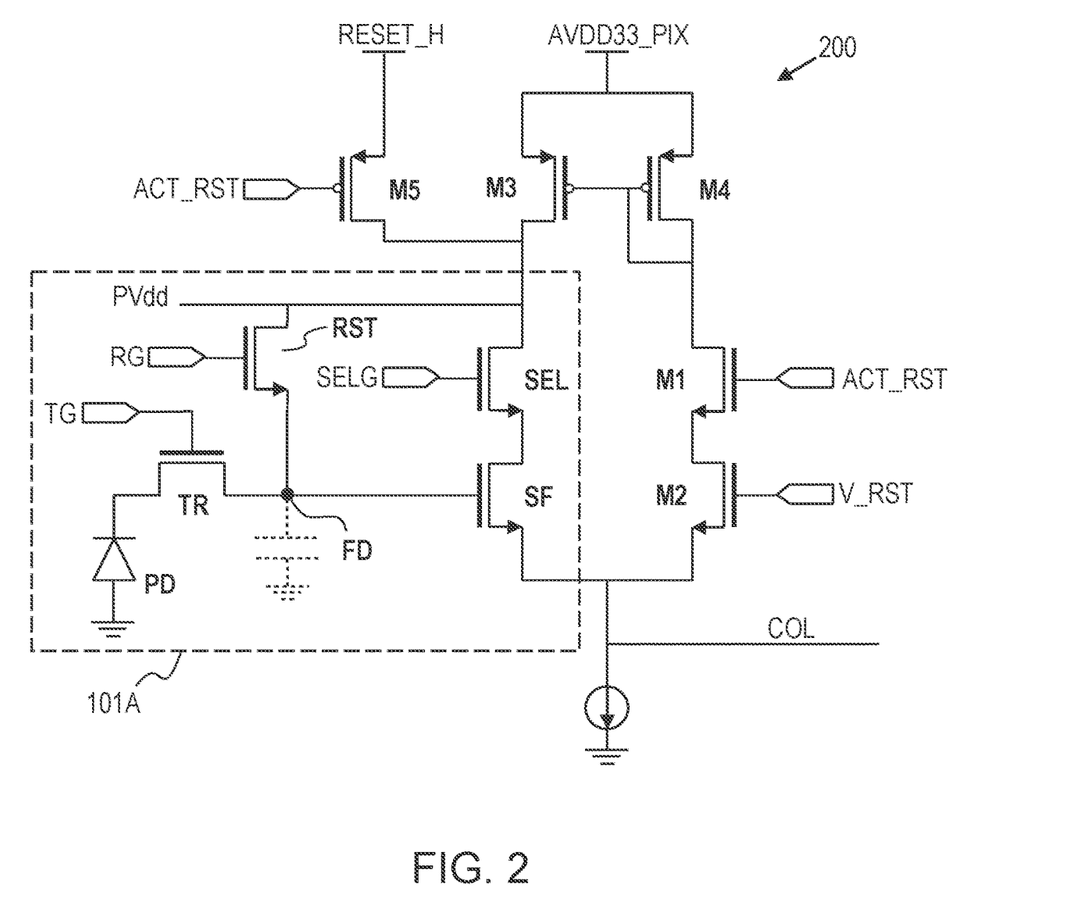
FIG. 2 is a circuit schematic illustrating a pixel circuit 101A and an active reset circuit 200.
Figure 4:
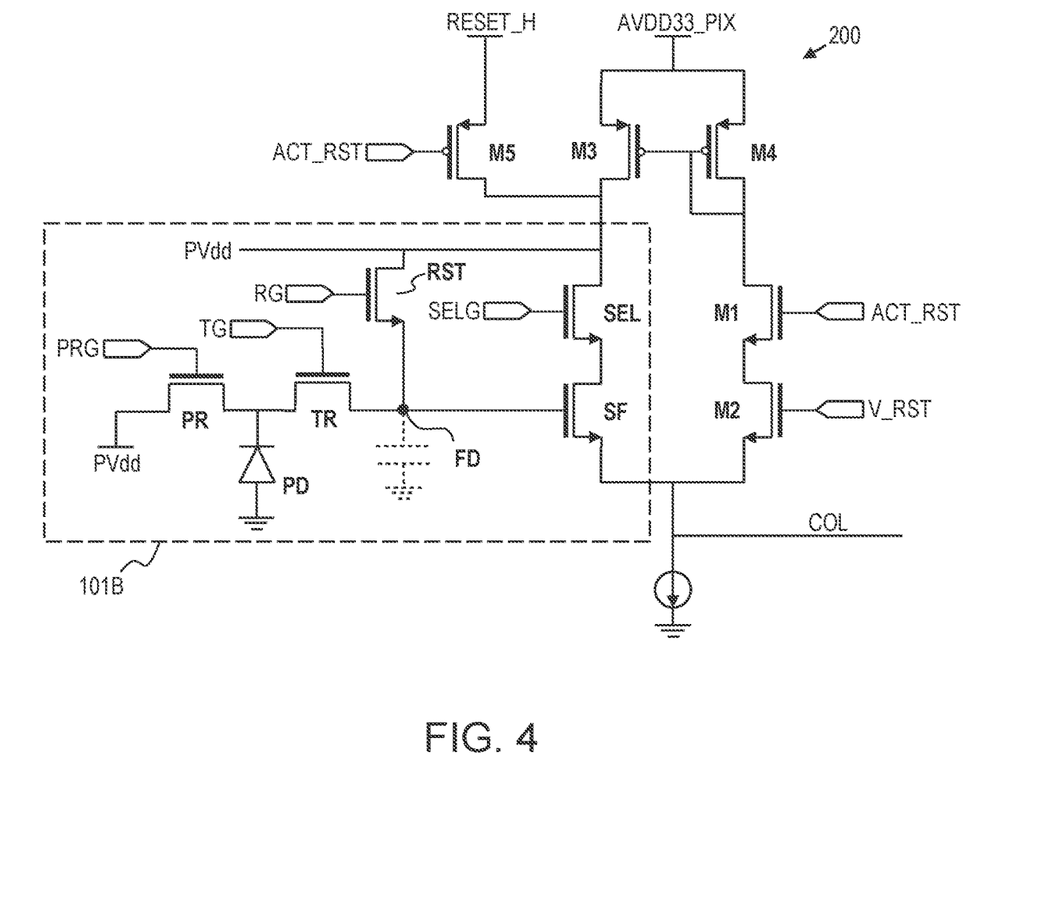
FIG. 4 is a circuit schematic illustrating a pixel circuit 101B and an active reset circuit 200.

FIGS. 2 and 4 illustrate exemplary pixel circuit layouts. FIG. 2 illustrates an exemplary 4T pixel circuit 101A, while FIG. 4 illustrates and exemplary 5T pixel circuit 101B. The pixel circuits 101A and 101B each include a light-sensing element such as a photodiode PD, a storage element such as the floating diffusion FD, a transfer transistor TR, a reset transistor RST, a selection transistor SEL, and a source-follower transistor SF. The transfer transistor TR is disposed between the photodiode PD and the floating diffusion FD, and is controlled by the transfer gate control signal TG. The transfer transistor TR controls a charge transfer operation in which charge accumulated in the PD is transferred to the FD. The reset transistor RST is disposed between a power supply line PVdd and the floating diffusion FD, and is controlled by the reset gate control signal RG. The reset transistor RST controls a passive FD reset operation in which the FD is connected to the power supply line PVdd to clear out charges and reset the FD. In the 4T transistor 101A, the transfer transistor TR and the reset transistor RST also collectively control a PD reset operation in which the PD is connected to the power supply line PVdd to clear out charges and reset the PD. The selection transistor SEL is disposed between the power supply line PVdd and the source-follower transistor SF, and is controlled by the selection gate control signal SELG. The selection transistor SEL controls a current path to the source follower transistor SF, and thereby controls a pixel signal readout operation in which the source follower SF outputs a signal to the column line COL. The source follower transistor SF has a gate electrode connected to the FD and an output terminal connected to the column line COL. A signal output by the source follower transistor SF during a readout operation is based on the amount of charge (i.e., voltage) held in the FD, and therefore the pixel signal read out on the column line COL is indicative of the amount of charge held in the FD.

The 5T pixel circuit 101B shown in FIG. 4 additionally includes a PD reset transistor PR, which is controlled by the PD reset gate signal PRG. Unlike in the 4T pixel circuit 101A, in the 5T pixel circuit 101B the PD reset transistor PR controls the PD reset operation, in which the PD is connected to the power supply line to clear out charges and reset the PD.

Although 4T and 5T pixel circuits are described above, it will be understood by one of ordinary skill in the art that other types of pixel circuits could also be used. In particular, more or fewer components could be included in the pixel circuits 101, and the components could be differently arranged. For example, an additional storage unit could be included in the pixel circuits 101 to facilitate global shutter exposure methods, and an additional transfer transistor could be included to control transfer to/from this storage unit. As another example, a single photodiode PD could be shared by multiple pixel circuits 101.

[Active Reset Circuit and Reset Operations]

FIGS. 2 and 4 illustrate active reset circuits 200, in addition to the pixel circuits 101A and 101B. Although only one active reset circuit 200 is illustrated, the image sensor 100 may include multiple active reset circuits 200. For example, there may be one active reset circuit 200 per column, with each pixel circuit 101 in a given column sharing the active reset circuit 200 for that column. The active reset circuit 200 shares some components with the pixel circuits 101 to which it is connected, while other components of the active reset circuit 200 are provided separately from the pixel circuits 101 (for example, in a peripheral portion of the pixel array unit 110). In particular, the active reset circuit 200 includes the selection transistor SEL and the source follower transistor SF of each of the pixel circuits 101 that is connected to the respective active reset circuit 200, as well as the transistors M1, M2, M3, M4, and M5 provided separately from the pixel circuits 101.

The transistor M3, the selection transistor SEL, and the source follower transistor SF are disposed in a first current path between the power source AVDD33_PIX and the column signal line COL. The transistors M4, M1, and M2 are in a second current path between the power source AVDD33_PIX and the column signal line COL.

While only one pixel circuit 101A and 101B is illustrated in FIGS. 2 and 4, it will be understood that multiple pixel circuits 101 (e.g., an entire column) may be connected to a given active reset circuit 200. For example, the selection transistor SEL and the source follower SF of each pixel circuit 101 that corresponds to a given active reset circuit 200 may be connected to the transistor M3 of the given active reset circuit 200. In such a case, for a single active reset circuit 200 there will be multiple "first current paths" (one for each pixel circuit 101 connected to the active reset circuit 200) and one "second current path". For example, each of the "first current paths" goes through the single transistor M3, but then the paths branch out into parallel path segments that respectively go through the various pixel circuits' 101 transistors SEL and SF, and then the paths reunite at the single column signal line COL.

The gates of the transistors M3 and M4 are connected to each other, and the transistor M4 is diode connected. The transistor M1 is controlled by the active reset enable signal ACT_RST. The gate of the transistor M2 receives the FD voltage re-setting signal V_RST. The transistor M5 is disposed between the power source RESET_H and the power supply line PVdd. The power supply line PVdd is column routed metal as opposed to an interconnected mesh.

The transistor M5 and the transistor M1 are controlled so as to have opposite conductive states during operation of the image sensor 100. In the exemplary embodiments shown in FIGS. 2 and 4, this is accomplished by making the transistors M5 and M1 have opposite channel types and providing the same control signal (ACT_RST) to them. Thus, when ACT_RST is high, M5 is in an OFF state and M1 is an ON state, and when ACT REST is low, M5 is in an ON state and M1 is an OFF state. Alternatively, M5 and M1 could be the same channel type, and could have opposite control signals supplied thereto.

The transistors M5 and M1 are used to control whether the pixel circuit 101 will perform a passive reset operation or an active reset operation. When ACT_RST is low, the column routed power supply line PVdd is connected to the power source RESET_H, while the second current path through M4, M1, and M2 is cut off by M1. This allows for performance of the passive reset operation by controlling the RG signal to the reset transistor RST. When ACT_RST is high, the column routed power supply line PVdd is cut off from the power source RESET_H by M5, and when SELG is also placed high the first current path through M3, SEL, and SF and the second current path through M4, M1, and M2 are enabled to perform the active reset operation.

Figure 3A:
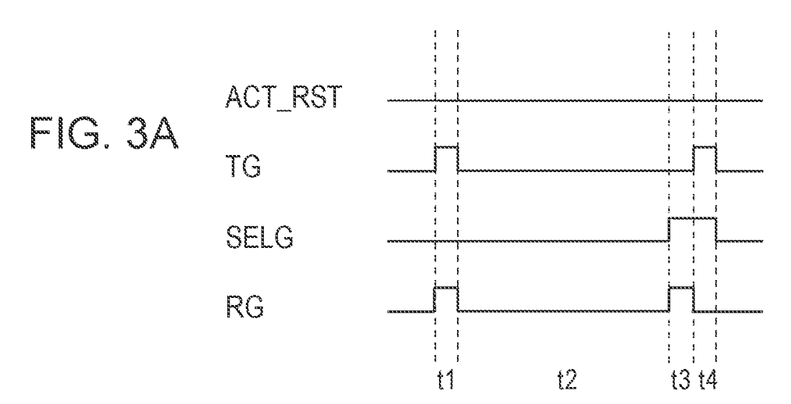
FIGS. 3A and 3B are timing diagrams illustrating operations of the pixel circuit 101A.
Figure 3B:
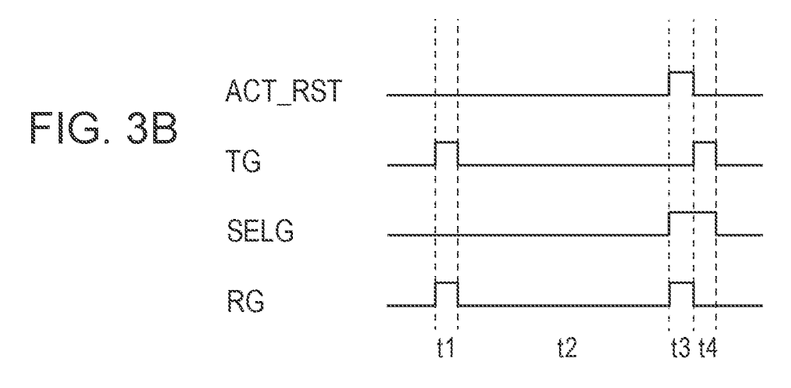
Figure 5A:
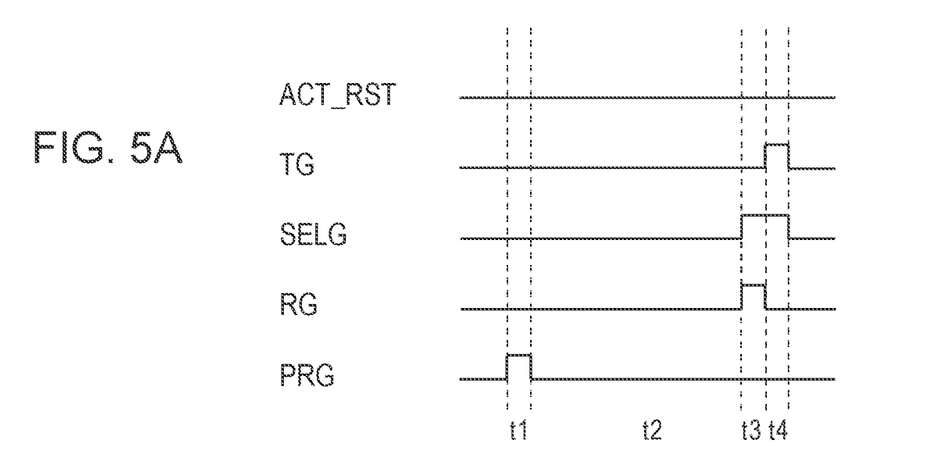
FIGS. 5A and 5B are timing diagrams illustrating operations of the pixel circuit 101A.
Figure 5B:
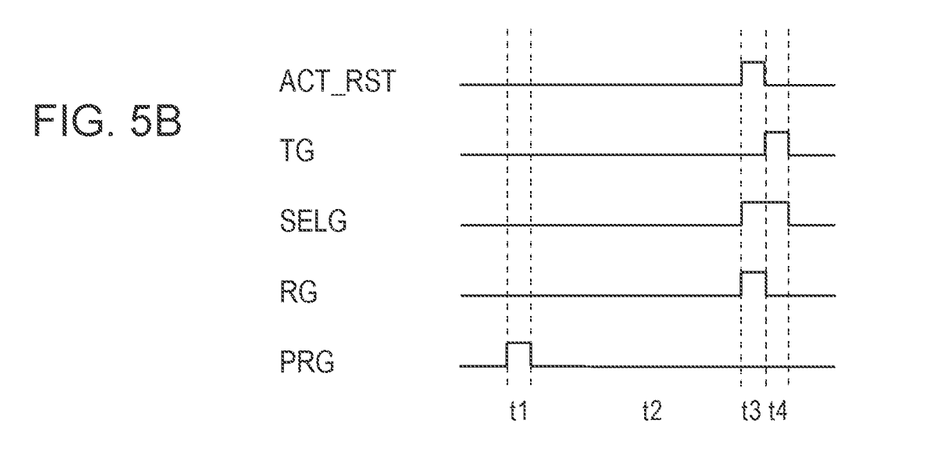

FIGS. 3(A) and 3(B) illustrate operations of the 4T pixel circuit 101A, while FIGS. 5(A) and 5(B) illustrate operations of the 5T pixel circuit 101B. The operations in FIGS. 3(A) and 5(A) include the passive reset operation, while the operations in FIGS. 3(B) and 5(B) include the active reset operation.

As shown in FIG. 3(A), in time period t1 a photodiode reset operation is performed by turning ON the transfer transistor TR and the reset transistor RST using control signals TG and RG, respectively. Because ACT_RST is low, the power supply line PVdd is connected to the power source RESET_H, and thus the PD is connected to the power source RESET_H and cleared of charge. The PD reset operation may begin an accumulation period or exposure period (t2-t3) during which the PD is exposed to light and accumulates electric charge based on the incident light. In period t3, the passive FD reset operation is performed by turning ON the reset transistor RST using control signal RG (note that ACT_RST is low throughout the passive reset operation). This connects the FD to the power source RESET_H, thus clearing charge from the FD. The selection signal SELG is also asserted in time period t3, and therefore a first signal is read out through the column signal line COL, and since the FD is at the rest level at this time the signal that is read out reflects the reset level of the FD. Next, in time period t4 the transfer transistor TR is turned ON using the control signal TG, which transfers the accumulated charge in the PD to the FD (thus ending the accumulation/exposure period). Because the selection signal SELG is also high in period t4, a second signal is read out through the column signal line COL, and since the FD at this time holds the charge from the PD, the second signal reflects the reset level of the FD plus the charge from the PD (the light dependent portion of the signal). The first signal and the second signal may be used subsequently for a CDS operation (not illustrated).

In the 5T pixel circuit 101B shown in FIG. 5(A), the PD reset operation is performed in time period t1 by turning on the PD reset transistor PR using the control signal PRG, instead of using TG and RST as in the 4T pixel circuit 101A. Other operations illustrated in FIG. 5(A) are similar to those of the 4T pixel circuit 101A shown in FIG. 3(A), and thus duplicative explanation thereof will be omitted.

In contrast to the passive reset operations shown in FIGS. 3(A) and 5(A), as shown in FIGS. 3(B) and 5(B), when the active FD reset operation is performed in time period t3, a fixed voltage RESET_H is not utilized. Instead, when the active FD reset operation is performed, the active reset enable signal ACT_RST is asserted, which cuts off the pixel circuit 101 from RESET_H by turning OFF the transistor M5. Moreover, the active pixel reset circuit 200 is enabled for the active reset operation by turning ON the transistor M1, the selection transistor SEL and the reset transistor RST. These operations result in the active reset operation being performed, which will be described in greater detail below. Other operations besides the active reset operation that are shown in FIGS. 3(B) and 5(B) are similar to those illustrated in FIGS. 3(A) and 5(A) and discussed above, and thus duplicative explanation thereof will be omitted.

As a result of the signals shown in time period t3 in FIGS. 3(B) and 5(B), the active pixel reset circuit 200 is placed in a condition in which current flows through the first current path (M3, SEL, SF) and the second current path (M4, M1, M2). In this state, the two current paths of the active pixel reset circuit 200 act similarly to two halves of a comparator. Thus, a voltage will quickly stabilize on the FD, and this voltage will be equal to the voltage V_RST that is applied to the transistor M2, assuming that design parameters (e.g., channel length and width, etc.) of the transistors in the active pixel reset circuit 200 are well matched and that V_RST is within the operating range of the circuit (which is roughly Vdd−2*Vds down to Vt above the ground). Thus, by controlling V_RST, the active reset operation allows the level of the floating diffusion FD to be set to a desired voltage, in contrast to the passive reset operation in which the level of the floating diffusion upon reset is reset to a level determined by RESET_H. By using the active reset operation, many forms of reset signal variation are removed. While pixel KTC noise and a portion of reset signal charge injection remain, in most image sensors the KTC noise of the pixel and remaining reset charge injection are not sufficiently large to present a substantial limitation on analog gain or dynamic range.

Figure 6:
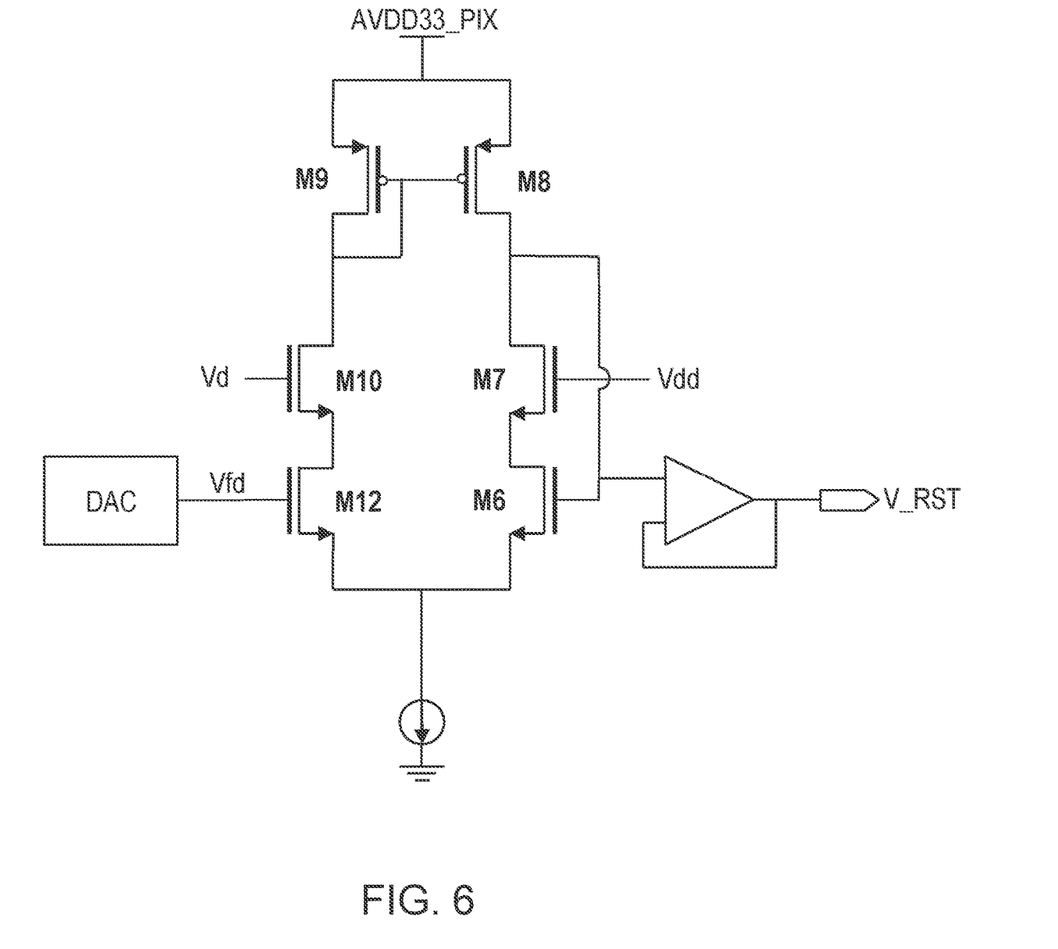
FIG. 6 is a circuit schematic illustrating a reset voltage generating circuit 600.

The voltage V_RST may be a fixed voltage, or it may be variably set to any of a number of possible voltages. For example, the reset voltage generating circuit 600 shown in FIG. 6 may be used to generate the voltage V_RST. The circuit 600 includes transistors M6, M7, M8, M9, M10, and M12 in a comparator-like configuration, with the gates of M9 and M8 connected to each other and M9 being diode connected. A target voltage Vfd may be applied to the gate of the transistor M12. For example, a digital-to-analog converter DAC may be used to set the target voltage Vfd. In this configuration, the gate of the transistor M6 will settle on a voltage that is based on the target voltage Vfd—indeed, the voltage of the gate of the transistor M6 should equal the target voltage Vfd assuming that the design parameters of the transistors are matched. The voltage may then be fed through a unity-gain buffer amplifier to remove the load from the circuit 600, and the voltage V_RST may be output.

The active reset circuit 200 is subject to noise related to the size and process of the transistors (such as thermal and 1/f noise), and therefore it can be advantageous to increase the size of the transistors to reduce these noise sources. However, it may be undesirable in certain circumstances to increase the size of the transistors SEL and SF in the pixel 101 (due to a desired pixel pitch). Thus, the size of the transistors M1 and M2 may be increased to reduce noise, while the size of the transistors SEL and SF may be kept small. However, doing so results in the transistors M1 and M2 no longer matching the transistors SEL and SF, and therefore it may be difficult to accurately set the FD to a desired voltage. In other words, in this case the voltage that settles on the FD is not guaranteed to be the same as the target voltage due to voltage shift that occurs in the circuit 200 resulting from the mismatched transistors. However, this difficulty can be avoided by matching the transistor design parameters, such as channel length and width, of the transistors in the circuit 600 with the design parameters of corresponding transistors in the circuit 200. In particular, M10 may be matched to SEL, M12 may be matched to SF, M6 may be matched to M2, and M7 may be matched to M1. By matching the transistors of the circuit 200 and the circuit 600 in this way, the effects of mismatched transistors within the circuit 200 may be counteracted. For example, if the transistor size of transistor M2 is changed in the circuit 200, it will result in a voltage shift in the circuit 200; however, if the size of the transistor M6 is changed equally in the circuit 600, then the same voltage shift will occur in the circuit 600 and will tend to cancel out the voltage shift in the circuit 200. That is, by matching the transistors in the circuit 200 and the circuit 600, the circuits will realize compensating shifts in voltage such that the voltage realized at the FD of the pixel circuit 101 will ultimately be equal to the target voltage Vfd. This allows the circuit designer to use larger transistors where practical to limit noise (such as for M1 and M2) without having to increase the size of the transistor SEL and SF inside the pixels 101.

In the description above and in the appended claims, reference is made to turning transistors ON and OFF. It will be understood that a transistor is turned ON when a channel is formed therein, and is turned OFF when the channel is not formed. Moreover, in the description above and in the appended claims, references are made to a channel length and channel width of two transistors being "the same" or "matched". It will be understood that this does not require the features to be exactly mathematically the same, which is, of course, impossible. Instead, references to channel length and channel width of two transistors being "the same" or "matched" means that the channel regions of the transistors (the regions in which a channel is formed when the transistor is turned ON) have dimensions (channel lengths and channel widths) that are within ±10% of one another. That is, the channel length of the first transistor is within ±10% of the channel length of the second transistor, and the channel width of the first transistor is within ±10% of the channel width of the second transistor.

Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. An image sensor, comprising:
   pixel circuitry including:
      a light sensing element;
      a charge storage node coupled to the light sensing element;
      an output transistor configured to output a signal that is based on a potential of the charge storage node to an output line;
      a selection transistor; and
      a reset transistor coupled to the charge storage node and a power supply line, and first circuitry including:
   a switching transistor that couples a power supply node to the power supply line;
   a first transistor coupled to a power source and the selection transistor;
   a second transistor coupled to the power source, a gate of the second transistor coupled to a gate of the first transistor;
   a third transistor coupled to the second transistor; and a fourth transistor coupled to the third transistor and the output line.

2. The image sensor of claim 1, further comprising:
second circuitry; and
a digital-to-analog converter coupled to a gate of the fourth transistor via the second circuitry.

3. The image sensor of claim 2,
wherein the second circuitry includes a fifth transistor coupled to a ground level, a sixth transistor coupled to the fifth transistor, a seventh transistor coupled to the sixth transistor and the power source, an eighth transistor coupled to the ground level, a ninth transistor coupled to the eighth transistor and a tenth transistor coupled to the ninth transistor and the power source,
wherein the digital-to-analog converter is coupled to a gate of the eighth transistor, and
wherein a gate of the seventh transistor is coupled to a gate of the tenth transistor.

4. The image sensor of claim 3,
wherein a channel length and a channel width of the first transistor are substantially the same as those of the tenth transistor,
wherein a channel length and a channel width of the selection transistor are substantially the same as those of the ninth transistor,
wherein a channel length and a channel width of the output transistor are substantially the same as those of the eighth transistor,
wherein a channel length and a channel width of the second transistor are substantially the same as those of the seventh transistor,
wherein a channel length and a channel width of the third transistor are substantially the same as those of the sixth transistor, and
wherein a channel length and a channel width of the fourth transistor are substantially the same as those of the fifth transistor.

5. The image sensor of claim 3,
wherein a channel length of the first transistor is within ±10% of a channel length of the tenth transistor and a channel width of the first transistor is within ±10% of that of a channel width of the tenth transistor,
wherein a channel length of the selection transistor is within ±10% of a channel length of the ninth transistor and a channel width of the selection transistor is within ±10% of a channel width of the ninth transistor,
wherein a channel length of the output transistor is within ±10% of a channel length of the eighth transistor and a channel width of the output transistor is within ±10% of a channel width of the eighth transistor,
wherein a channel length of the second transistor is within ±10% of a channel length of the seventh transistor and a channel width of the second transistor is within ±10% of a channel width of the seventh transistor,
wherein a channel length of the third transistor is within ±10% of a channel length of the sixth transistor and a channel width of the third transistor is within ±10% of a channel width of the sixth transistor, and
wherein a channel length of the fourth transistor is within ±10% of a channel length of the fifth transistor and a channel width of the fourth transistor is within ±10% of a channel width of the fifth transistor.

6. The image sensor of claim 1,
wherein the first circuitry is configured to set a potential of the charge storage node based on a potential of the fourth transistor when the selection transistor and the third transistor are both ON state.

7. The image sensor of claim 2,
wherein the second circuitry is configured to generate a reset level control signal that is applied to the gate of the fourth transistor.

8. The image sensor of claim 7,
wherein the reset level control signal is based on a potential of a gate of the fifth transistor.

9. The image sensor of claim 8,
wherein the image sensor is configured to selectively perform a first reset operation and a second reset operation, wherein the first reset operation includes turning the switching transistor and the reset transistor ON state while the selection transistor and the third transistor are OFF state, and the second reset operation includes turning the selection transistor and the third transistor ON state while the switching transistor is OFF state.

10. The image sensor of claim 9,
wherein a polarity of the third transistor is opposite to a polarity of the switching transistor.

* * * * *